(12) United States Patent
Cho

(10) Patent No.: US 11,112,548 B2
(45) Date of Patent: Sep. 7, 2021

(54) OPTICAL FILM AND DISPLAY DEVICE INCLUDING THE SAME

(71) Applicant: LG Display Co., Ltd., Seoul (KR)

(72) Inventor: Won-Jong Cho, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 344 days.

(21) Appl. No.: 16/214,691

(22) Filed: Dec. 10, 2018

(65) Prior Publication Data
US 2019/0189962 A1   Jun. 20, 2019

(30) Foreign Application Priority Data

Dec. 19, 2017 (KR) .......................... 10-2017-0175002

(51) Int. Cl.
| | | |
|---|---|---|
| *H01L 51/52* | (2006.01) | |
| *H01L 51/50* | (2006.01) | |
| *G02B 5/30* | (2006.01) | |
| *B32B 3/12* | (2006.01) | |

(52) U.S. Cl.
CPC .............. *G02B 5/3016* (2013.01); *B32B 3/12* (2013.01); *H01L 51/5281* (2013.01); *H01L 2251/5338* (2013.01)

(58) Field of Classification Search
CPC ...................................................... B32B 3/12
See application file for complete search history.

(56) References Cited

U.S. PATENT DOCUMENTS

| | | |
|---|---|---|
| 2016/0085352 A1 | 3/2016 | Kang |
| 2016/0255713 A1 | 9/2016 | Kim et al. |
| 2017/0262022 A1 | 9/2017 | Choi et al. |

FOREIGN PATENT DOCUMENTS

| | | |
|---|---|---|
| CN | 105870361 A | 8/2016 |
| CN | 105929990 A | 9/2016 |
| JP | 2005-183836 A | 7/2005 |

OTHER PUBLICATIONS

Office Action issued in corresponding Chinese Patent Application No. 201811552667.7 dated Nov. 4, 2020 (see partial translation).

*Primary Examiner* — Ian A Rummel
(74) *Attorney, Agent, or Firm* — Morgan, Lewis & Bockius LLP

(57) ABSTRACT

An optical film for a display device includes: a first mesh pattern layer in which a plurality of first mesh patterns each including a first inner hole are arranged; and a second mesh pattern layer which faces the first mesh pattern layer, and in which a plurality of second mesh patterns each including a second inner hole are arranged, wherein a center of the first mesh pattern and a center of the second mesh pattern are arranged to be misaligned.

20 Claims, 9 Drawing Sheets

OPTICAL FILM AND DISPLAY DEVICE INCLUDING THE SAME

CROSS-REFERENCE TO RELATED APPLICATIONS

The present application claims the priority benefit of Korean Patent Application No. 10-2017-0175002 filed on Dec. 19, 2017, which is hereby incorporated by reference in its entirety for all purposes as if fully set forth herein.

BACKGROUND

Technical Field

The present disclosure relates to an optical film and a display device including the same.

Discussion of the Related Art

Recently, flat display devices having excellent properties of being thin and light and having low power consumption have been widely developed and applied in various fields.

An organic light emitting display device (OLED) called an organic electroluminescent display device, among the flat display devices, is an element configured to emit light while charges are injected into a light emitting layer formed between a cathode and an anode, electron-hole pair are generated, and the electron-hole pairs disappear.

The OLED may be formed on a flexible substrate such as plastic, and has a large contrast ratio because the OLED is a self-luminous type device. Further, moving pictures are easily realized on the OLED because a response time thereof is about several micro seconds, and the OLED has no limitations in viewing angle and is stable at a low temperature. Further, the OLED is driven with a relatively low direct current (DC) voltage in the range of 5 V to 15 V, and thus driving circuit of the OLED is easily designed and manufactured.

Recently, demands for flexible or foldable display devices have increased, and accordingly studies on the flexible OLED s are actively being carried out.

A flexible level of an organic light emitting panel has been achieved, but a desired flexible level of an optical film such as a polarization film or phase retardation film attached to the organic light emitting panel has yet to be achieved.

For example, when an extreme radius of curvature test (e.g., 1R test) of completely bending a display device is performed for a stretched type or photo-alignment type optical film according to the related art, a maximum stress applied to the optical film in a bent state exceeds a rupture strength. Accordingly, there is a problem in that cracks occur entirely over a bent portion.

SUMMARY

Accordingly, embodiments of the present disclosure are directed to an optical film and a display device that substantially obviate one or more of the problems due to limitations and disadvantages of the related art.

An aspect of the present disclosure is to provide a method of reducing cracks occurring in an optical film of a display device in a flexible state.

An aspect of the present disclosure is to provide an optical film and a display device including the same that can reduce cracks occurring in an optical film in a flexible state.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, an optical film for a display device comprises: a first mesh pattern layer in which a plurality of first mesh patterns each including a first inner hole are arranged; and a second mesh pattern layer which faces the first mesh pattern layer, and in which a plurality of second mesh patterns each including a second inner hole are arranged, wherein a center of the first mesh pattern and a center of the second mesh pattern are arranged to be misaligned.

In another aspect, an optical film for a display device comprises: a mesh pattern layer in which a plurality of mesh patterns each including an inner hole are arranged; and a dot pattern layer which faces the mesh pattern layer and in which a plurality of dot patterns are arranged corresponding to respective inner holes.

In another aspect, a display device comprises: an optical film; and a display panel to which the optical film is attached, wherein the optical film includes: a first mesh pattern layer in which a plurality of first mesh patterns each including a first inner hole are arranged; and a second mesh pattern layer which faces the first mesh pattern layer, and in which a plurality of second mesh patterns each including a second inner hole are arranged, wherein a center of the first mesh pattern and a center of the second mesh pattern are arranged to be misaligned.

In another aspect, a display device comprises: an optical film; and a display panel to which the optical film is attached, wherein the optical film includes: a mesh pattern layer in which a plurality of mesh patterns each including an inner hole are arranged; and a dot pattern layer which faces the mesh pattern layer and in which a plurality of dot patterns are arranged corresponding to respective inner holes.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles.

DETAILED DESCRIPTION

Reference will now be made in detail to embodiments, examples of which are illustrated in the accompanying drawings. The same reference numbers may be used throughout the drawings to refer to the same or like parts.

First Embodiment

Figure 1:
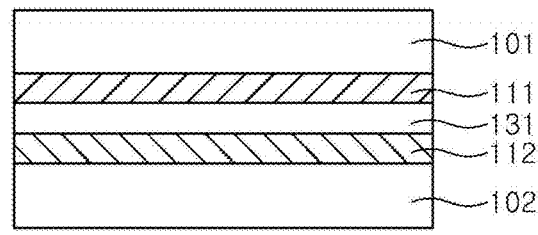
FIGS. 1 and 2 are schematic cross-sectional and perspective views, respectively, illustrating an optical film of a display device according to a first embodiment of the present invention.
Figure 2:
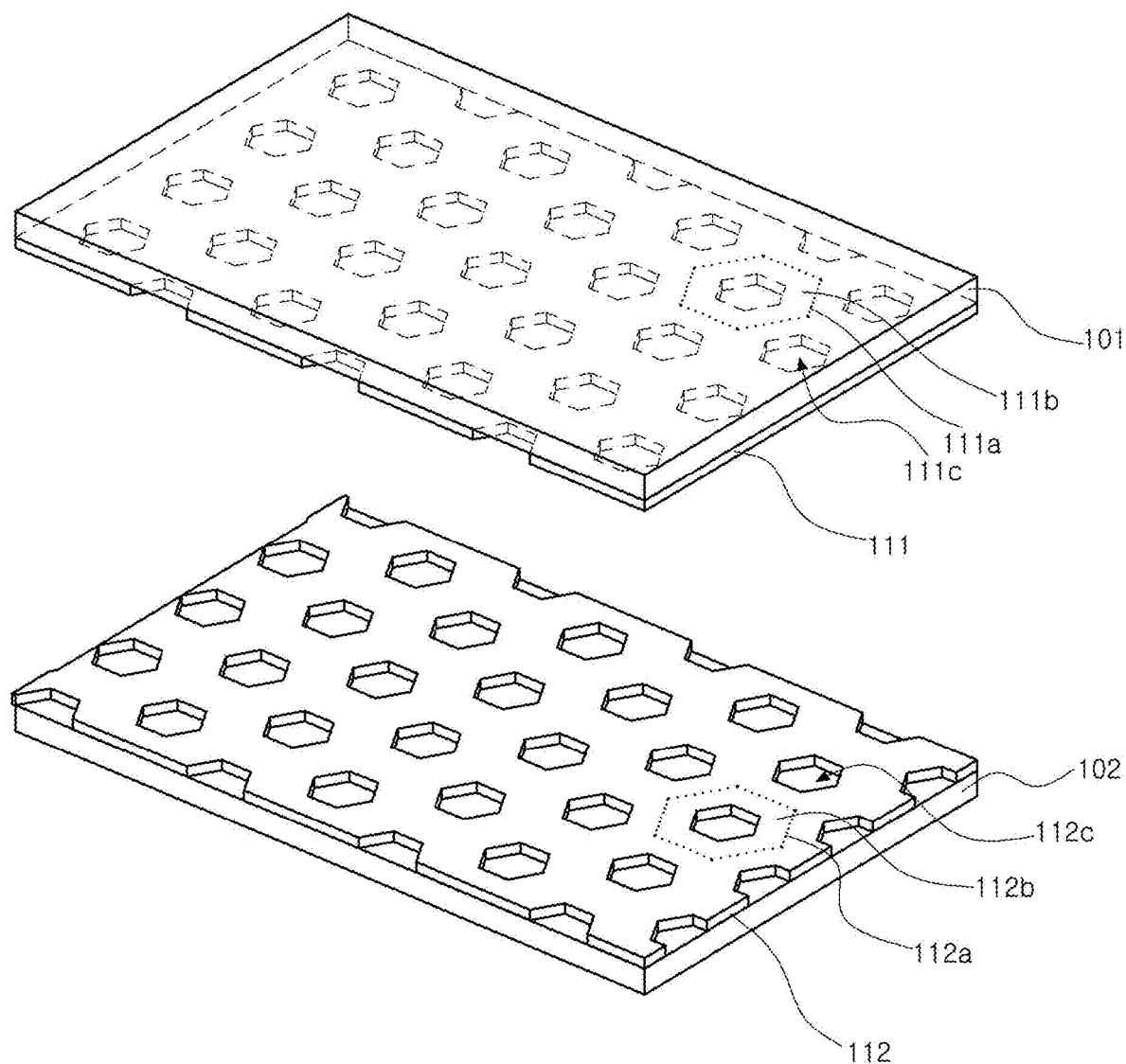

FIGS. 1 and 2 are schematic cross-sectional and perspective views, respectively, illustrating an optical film of a display device according to a first embodiment of the present invention. A detailed structure of a mesh pattern layer is not illustrated in FIG. 1 for the purpose of explanations.

Referring to FIGS. 1 and 2, an optical film 100 for a display device according to the present embodiment may be applied to a flexible display device.

The optical film 100 may be used as a linear polarization film, or phase retardation film such as an A-plate or C-plate.

In this embodiment, for the purpose of explanations, a case in which the optical film 100 is used as the linear polarization film is described by way of example.

The optical film 100 may include a first mesh pattern layer 111 and a second mesh pattern layer 112 as two mesh pattern layers 111 and 112 which face (or are opposite to) each other.

In addition, the optical film 100 may include a first protection base layer (or first protection substrate) 101 attached to an outer surface of the first mesh pattern layer 111, and a second protection base layer (or second protection substrate) 102 attached to an outer surface of the second mesh pattern layer 112.

Here, for the purpose of explanations, a case in which the first mesh pattern layer 111 is disposed above the second mesh pattern layer 112 is described by way of example.

One of the first protection base layer 101 and the second protection base layer 102 may be removed in a case in which the optical film 100 is attached to a display panel of a display device.

In other words, in a state in which the optical film 100 is attached to the display panel, one of the first and second protection base layers 101 and 102 may be removed.

In addition, a first bonding layer 131 which is a bonding layer (or adhesion layer) for bonding the first mesh pattern layer 111 and the second mesh pattern layer 112 may be formed therebetween.

The first mesh pattern layer 111 and the second mesh pattern layer 112 may substantially have mesh structures over the entire optical film 100.

The first mesh pattern layer 111 and the second mesh pattern layer 112 may function together as a linear polarization plate.

In other words, the first mesh pattern layer 111 functions as a part of the linear polarization plate, and the second mesh pattern layer 112 functions as another part of the linear polarization plate, so that a stacked structure thereof may function as the linear polarization plate.

To this end, the first mesh pattern layer 111 and the second mesh pattern layer 112 are each formed of a linear polarization material.

For example, the first mesh pattern layer 111 and the second mesh pattern layer 112 may be formed of a linear polarization liquid crystal material. In this regard, by radiating light such as ultraviolet (UV) light to the liquid crystal material to align liquid crystal molecules thereof, the first mesh pattern layer 111 and the second mesh pattern layer 112 may be formed to have a linear polarization property.

The first mesh pattern layer 111 and the second mesh pattern layer 112 may include mesh patterns which each are unit patterns for forming corresponding mesh structures. For example, the first mesh pattern layer 111 and the second mesh pattern layer 112 may include a plurality of first mesh patterns 111a and a plurality of second mesh patterns 112a, respectively.

In other words, the first mesh pattern layer 111 may be configured with the first mesh patterns 111a as the unit patterns which are arranged over a plane of the first mesh pattern layer 111. Similarly, the second mesh pattern layer 112 may be configured with the second mesh patterns 112a as the unit patterns which are arranged over a plane of the second mesh pattern layer 112.

The first mesh pattern 111a and the second mesh pattern 112a may be preferably formed in the same shape. In addition, the first mesh pattern 111a and the second mesh pattern 112a may be preferably formed to have the same size.

The first mesh pattern 111a and the second mesh pattern 112a may have any kind of polygonal mesh shape such as a triangular mesh shape, a tetragonal mesh shape, a pentagonal mesh shape, or a hexagonal mesh shape.

In this embodiment, for the purpose of explanations, a case in which the first mesh pattern 111a and the second mesh pattern 112a are formed in a hexagonal mesh shape e.g., a honeycomb shape, is described by way of example.

The first mesh patterns 111a and the second mesh patterns 112a may each include partition walls 111b and 112b to form a corresponding shape, for example, the hexagonal mesh shape. Inner holes 111c and 112c as opening spaces, which are respectively surrounded by the partition walls 111b and 112b, are defined inside the first mesh patterns 111a and the second mesh patterns 112a.

In other words, the first mesh pattern 111a may include the first partition wall 111b of the hexagonal shape, and the first inner hole 111c of the hexagonal shape surrounded by the first partition wall 111b is formed inside the first mesh pattern 111a.

In addition, the second mesh pattern 112a may include the second partition wall 112b of the hexagonal shape, and the second inner hole 112c of the hexagonal shape surrounded by the second partition wall 112b is formed inside the second mesh pattern 112a.

The first and second mesh pattern layers 111 and 112 may be formed using mesh masks which are masks having open holes in the corresponding mesh shapes. In this regard, the open holes of the mesh mask for each of the first and second mesh pattern layers 111 and 112 correspond to the partition walls of each of the first and second mesh pattern layers 111 and 112.

For example, while the first protection base layer 101 wound around a roll is moved in one direction, the mesh mask having the open holes in the mesh shape is placed on the first protection base layer 101. In this state, one surface of the first protection base layer 101 is coated with a liquid crystal material through the open holes of the mesh mask, and light is irradiated to the one surface to align the liquid crystal material. Accordingly, the first mesh pattern layer 111 may be formed on the first protection base layer 101.

Similarly, one surface of the second protection base layer 102 is coated with a liquid crystal material through a mesh mask, and light is irradiated to the one surface to align the liquid crystal material. Accordingly, the second mesh pattern layer 112 may be formed on the second protection base layer 102.

For the first mesh pattern layer 111 and the second mesh pattern layer 112 configured as described above, centers of the corresponding mesh patterns 111a and 112a are disposed to be misaligned.

In other words, the center of the first mesh pattern 111a and the center of the second mesh pattern 112a do not match, but are arranged to be misaligned.

In other words, a position of the second mesh pattern 111b is shifted with respect to a position of the first mesh pattern 111a so that the centers thereof do not match.

In this case, centers of the first mesh pattern layer 111 and the second mesh pattern layer 112 have an off-axis relationship such that the inner hole 112c of each second mesh pattern 112a may be covered and completely hidden by the first partition walls 111b of the first mesh patterns 111a corresponding to e.g., overlapping the inner hole 112c, and the inner hole 111c of each first mesh pattern 111a are covered and completely hidden by the second partition walls 112b of the second mesh patterns 112a corresponding to e.g., overlapping the inner hole 111c.

Figure 3:
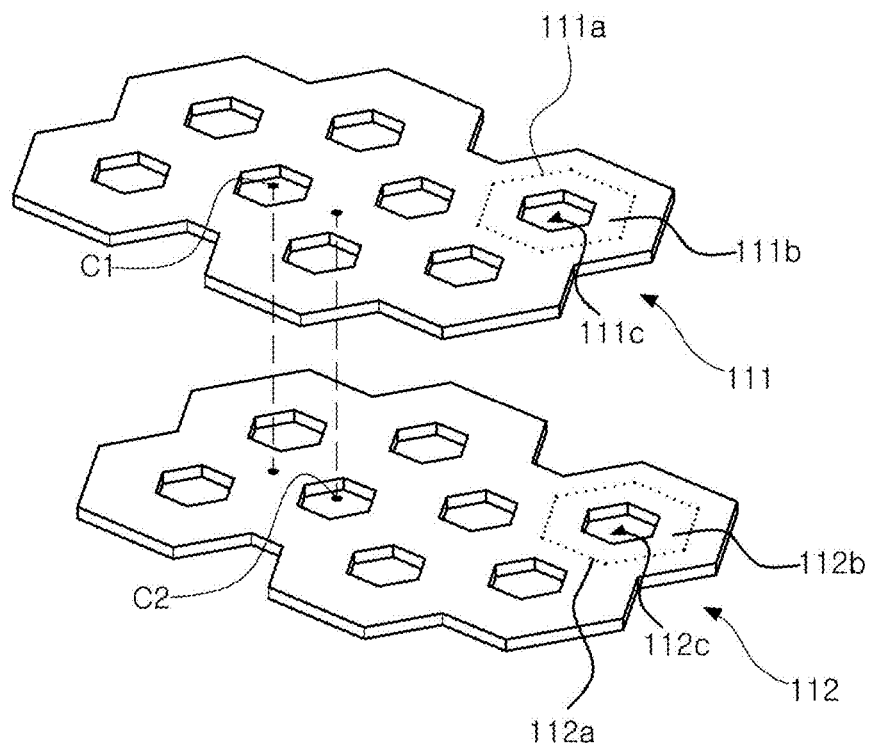
FIGS. 3 and 4 are schematic perspective and plan views, respectively, illustrating an arrangement relationship between first and second mesh pattern layers according to the first embodiment of the present invention.
Figure 4:
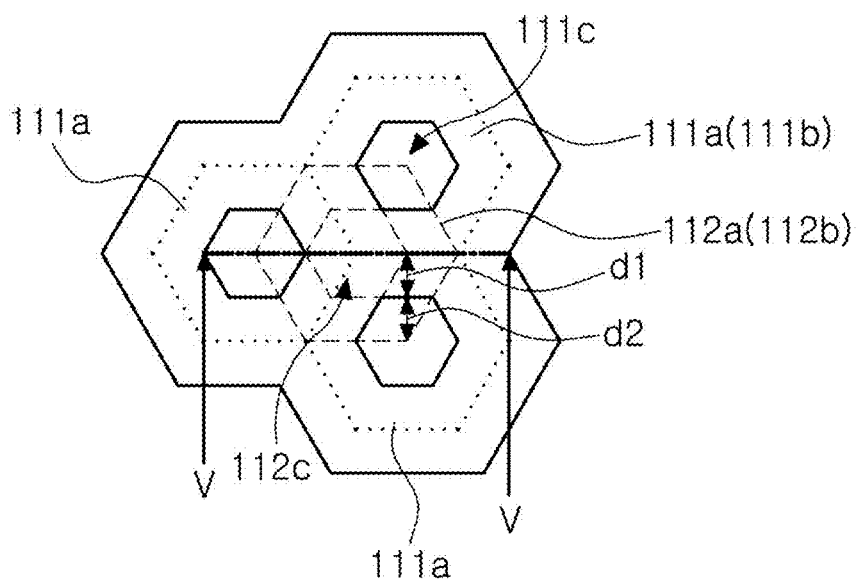
Figure 5:
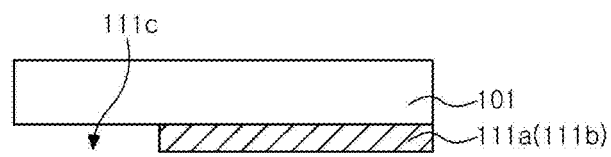
FIG. 5 is a cross-sectional view taken along line V-V of FIG. 4.
Figure 5:
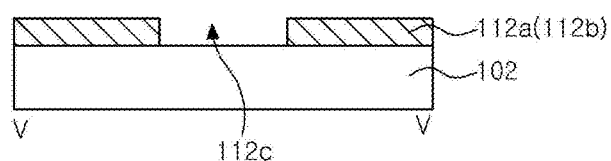

This is explained in detail further with reference to FIGS. 3 to 5.

FIGS. 3 and 4 are schematic perspective and plan views, respectively, illustrating an arrangement relationship between first and second mesh pattern layers according to the first embodiment of the present invention, and FIG. 5 is a cross-sectional view taken along a line V-V of FIG. 4.

Referring to FIGS. 3 to 5, the second mesh pattern layer 112, which is a lower mesh pattern layer, and the first mesh pattern layer 111 disposed above the second mesh pattern layer 112 may be disposed such that the centers of the mesh patterns thereof are misaligned.

In other words, a first center C1 which is a center of the first mesh pattern 111a and a second center C2 which a center of the second mesh pattern 112a do not match, but are arranged to be misaligned in an off-axis relationship.

For example, the first center C1 of the first mesh pattern 111a is arranged to be positioned at a center of a corner portion of the second mesh pattern 112a, where the corner is an edge at which two adjacent sides of the second mesh patterns 112a meet.

In other words, the first center C1 of the first mesh pattern 111a is arranged to be positioned at a center of a corner portion of the second partition wall 111c of the second mesh pattern 112a.

That is, the first center C1 of the first mesh pattern 111a is arranged to be positioned at a center point of a plurality of second mesh patterns 112a in contact with each other (e.g., three second mesh patterns 112a in contact with each other).

In the other way, the second center C2 of the second mesh pattern 112a is arranged to be positioned at a center point of a plurality of first mesh patterns 111a in contact with each other (e.g., three second mesh patterns 111a in contact with each other).

Since the first mesh patterns 111a and the second mesh patterns 112a are disposed such that the centers thereof are disposed to be misaligned, the second inner holes 112c of the second mesh patterns 112a may be completely covered and hidden by the second partition walls 111b of the first mesh patterns 111a overlapping the second inner holes 112c.

Similarly, the first inner holes 111c of the first mesh patterns 111a may be completely covered and hidden by second partition walls 112b of the second mesh patterns 112a overlapping the first inner holes 111c.

In this regard, when a width of each of the partition walls 111b and 112b of the first and second mesh patterns 111a and 112a (in more detail, a partition wall portion of one side of the hexagonal shape) is d1, and a vertical distance (or shortest distance, or normal distance) from a center of each of the first and second inner holes 111c and 112c to the corresponding partition walls 111b and 112b is d2, sizes of the first and second mesh patterns 111a and 112a may be set to have a relationship of d2≤d1.

In this case, the second inner hole 112c of the second mesh pattern 112a is completely hidden by its overlapping partition walls 111b of the first mesh patterns 111a.

Similarly, the first inner hole 111c of the first mesh pattern 111a is completely hidden by its overlapping partition walls 112b of the second mesh patterns 112a.

Since the first and second mesh patterns 111a and 112a are disposed to hide the inner holes 112c and 111c as described above, the stacked structure of the first and second mesh pattern layers 111 and 112 may be seen such that the material to form the mesh patterns are formed over the entire optical film 100, when viewed from above.

Accordingly, the entirety of the optical film 100 may have substantially uniform optical properties.

In addition, since the optical film 100 according to this embodiment is configured by stacking the pattern layers 111 and 112 having the mesh structures, the optical film 100 can be effectively applied to a flexible display device.

In this regard, since the mesh structure has the holes therein and a tensile or contractile force is dispersed along the mesh patterns in a bent state due to the structural properties, a stress applied to the mesh structure is significantly reduced.

Accordingly, since a maximum stress applied thereto in the bent state is much less than a rupture strength of the optical film 100 having the mesh structure, a crack occurrence can be reduced at a bent portion.

In addition, even when cracks may occur at the pattern layer of the mesh structure, the generated cracks can be prevented from spreading along the bent portion due to the structural properties of the mesh structure.

As described above, when the optical film 100 is formed in the mesh structure, cracks occurring at the bent portion can be effectively reduced.

Accordingly, the optical film 100 having the mesh structure can be effectively applied to a flexible display device.

Figure 6:
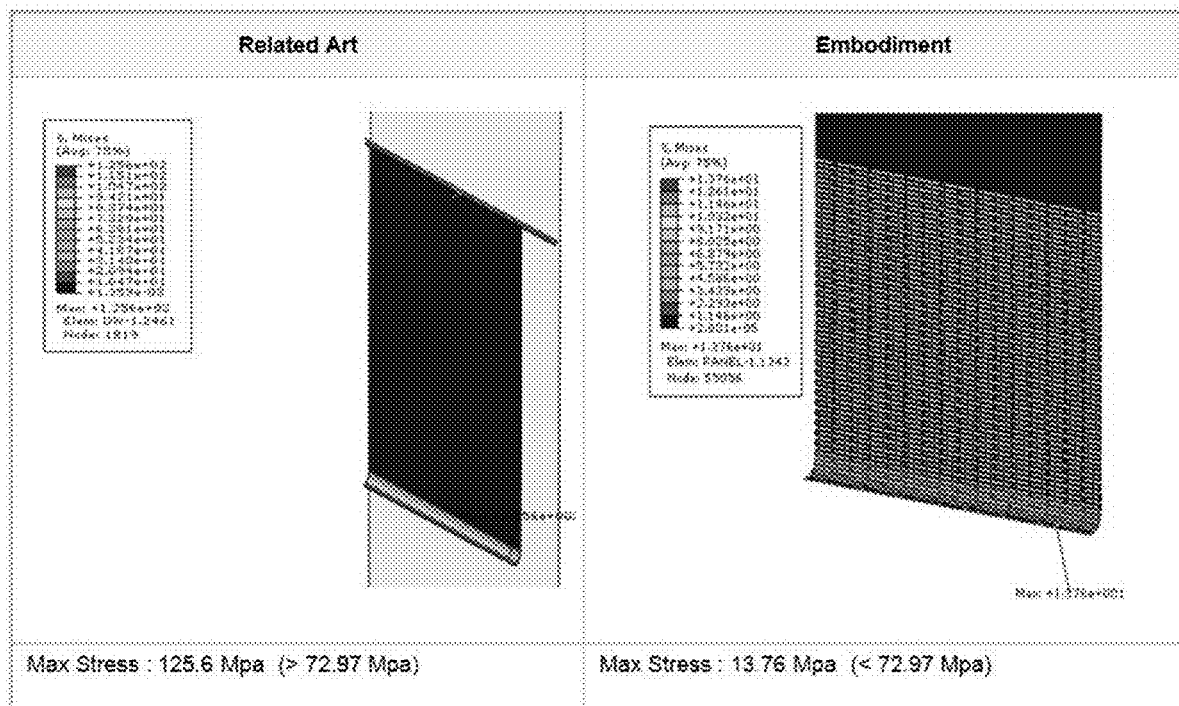
FIG. 6 is a view illustrating simulation results of radius of curvature tests of the related art optical film and the optical film according to the first embodiment of the present invention.

This refers to FIG. 6, which is a view illustrating simulation results of radius of curvature tests of the related art optical film and the optical film according to the first embodiment of the present invention.

Referring to FIG. 6, in the case of the related art optical film with a single layer formed of a photo-alignment liquid crystal material, cracks occur along an entire bent portion because a maximum stress applied to a bent portion is 125.6 MPa in an extreme radius of curvature test of 1R and is much greater than a rupture strength of 72.97 MPa.

To the contrary, in the case of the optical film 100 in the mesh structure according to this embodiment, a maximum stress applied to a bent portion is 13.76 MPa in an extreme radius of curvature test and is decreased by about 89% when compared to the related art case.

Since this maximum stress is much less than the rupture strength of 72.97 MPa, cracks do not occur practically when the optical film 100 is bent.

In the above-described embodiment, the optical film 100 having the mesh structure used as the linear polarization film is described by way of example.

Alternatively, the optical film 100 having the mesh structure may be used as a phase retardation film such as an A-plate or C-plate. In this case, the first mesh pattern layer 111 and the second mesh pattern layer 112 may be formed by a photo-alignment liquid crystal material having a phase retardation property to form the A-plate or C-plate.

Figure 7:
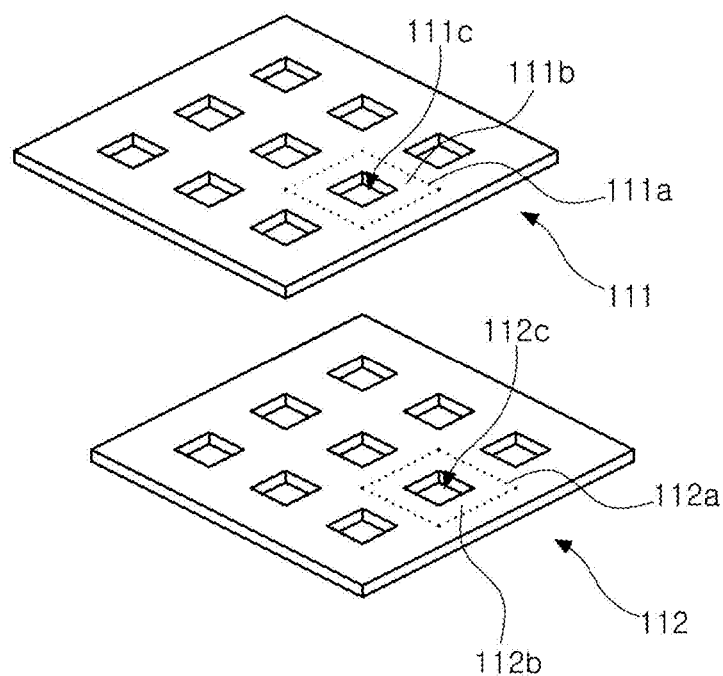
FIGS. 7 and 8 are views illustrating cases in which mesh pattern layers according to the first embodiment of the present invention has a tetragonal mesh structure and a triangular mesh structure.
Figure 8:
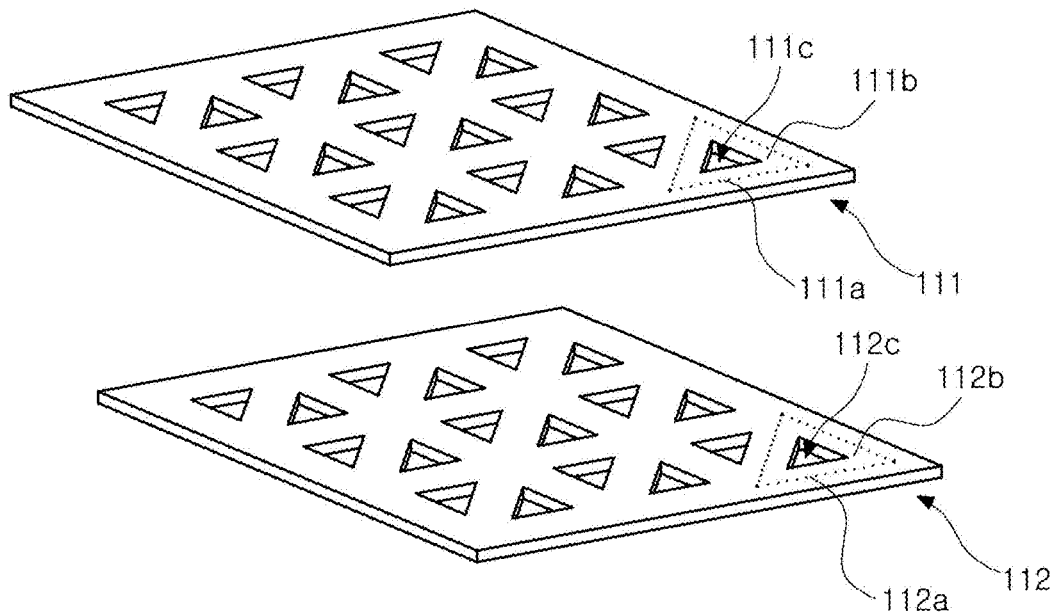

In addition, in the above embodiment, the hexagonal mesh structure is described by way of example. Alternatively, a tetragonal mesh structure or triangular mesh structure, as shown in FIG. 7 or 8, may also be used as another polygonal mesh structure.

In the tetragonal mesh structure or the triangular mesh structure, first mesh patterns of a first mesh pattern layer 111 and second mesh patterns of a second mesh pattern layer 112 are arranged to be misaligned.

In other words, a first center of the first mesh pattern 111a is arranged to be positioned at a center point of a plurality of second mesh patterns 112a in contact with each other. Similarly, a second center of the second mesh pattern 112a is arranged at a center point of a plurality of first mesh patterns 111a in contact with each other.

Accordingly, since the first and second mesh patterns 111a and 112a are disposed to hide inner holes 112c and 111c, a stacked structure of the first and second mesh patterns layers 111 and 112 may be seen such that the material to form the mesh patterns are formed over an entire surface of an optical film 100, when viewed from above.

The optical film 100 according to this embodiment may be configured as an optical compensation film in which a plurality of stacked structures, which each have a mesh structure with first and second mesh patterns 111a and 112a, are layered.

Figure 9:
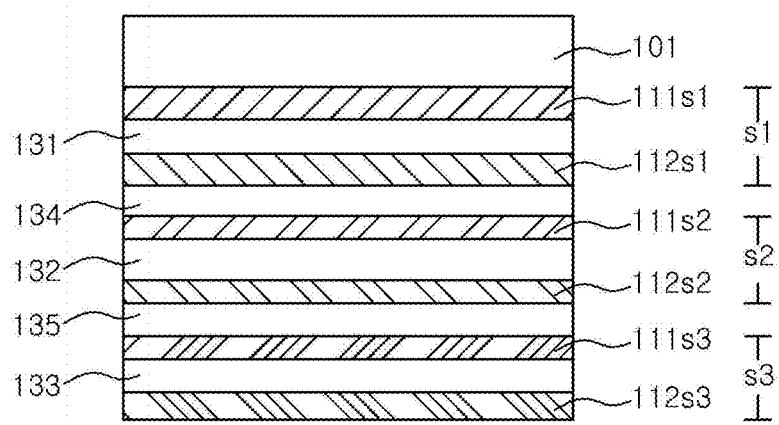
FIG. 9 is a view illustrating a case in which the optical film according to the first embodiment of the present invention includes a plurality of stacked structures having the mesh structure.

By way of example, as illustrated in FIG. 9, the optical film 100 may be formed such that a linear polarization stacked structure S1, an A-plate stacked structure S2, and a C-plate stacked structure S3 are stacked under a first protection base layer 101.

In each of the stacked structures, two mesh pattern layers may be disposed with a bonding layer interposed therebetween.

In other words, the linear polarization stacked structure S1 may include its first and second mesh patterns layers 111s1 and 112s1 and a first bonding layer 131 interposed therebetween. In addition, the A-plate stacked structure S2 may include its first and second mesh patterns layers 111s2 and 112s2 and a second bonding layer 132 interposed therebetween. In addition, the C-plate stacked structure S3 may include its first and second mesh patterns layers 111s3 and 112s3 and a third bonding layer 133 interposed therebetween.

Bonding layers configured to bond the adjacent stacked structures may be interposed between the adjacent stacked structures. In other words, a fourth bonding layer 134 may be interposed between the linear polarization stacked structure S1 and the A-plate stacked structure S2, and a fifth bonding layer 135 may be interposed between the A-plate stacked structure S2 and the C-plate stacked structure S3.

Figure 10:
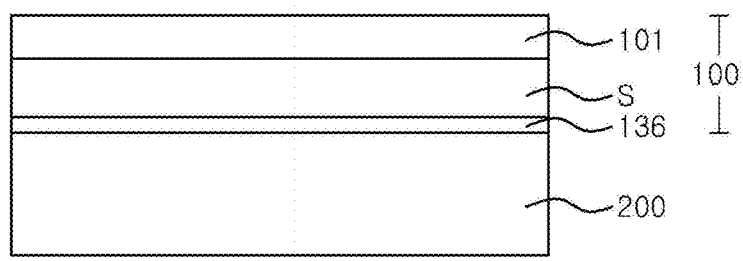
FIG. 10 is a schematic cross-sectional view illustrating a display device in which the optical film according to the first embodiment of the present invention is attached to a display panel.

FIG. 10 is a schematic cross-sectional view illustrating a display device in which the optical film according to the first embodiment of the present invention is attached to a display panel.

Referring to FIG. 10, a display device 10 includes the optical film 100 and a display panel 200.

The display panel 200 may have flexible properties and include any kind of display panel including an organic light emitting panel.

The optical film 100 having the mesh structure may be attached on a surface, for example, a display surface of the display panel 200.

In the optical film 100, a protection base layer, for example, the first protection base layer 101, may be disposed at an outermost side, and a stacked structure S having the mesh structure may be disposed on an inner surface of the first protection base layer 101. The stacked structure S having the mesh structure may be referred with the above description.

Further, the optical film 100 may be bonded to the display panel 200 by a sixth bonding layer 136.

As described above, in this embodiment, the optical film may be formed by stacking two pattern layers having the mesh structures.

Accordingly, since a maximum stress applied to the optical film in a bent state is much less than a rupture strength of the optical film of the mesh structure, crack occurrence at a bent portion can be reduced.

Accordingly, the optical film of the mesh structure can be effectively applied to a flexible display device.

Second Embodiment

In the following second embodiment, detailed explanations of components identical or similar to those of the first embodiment may be omitted.

Figure 11:
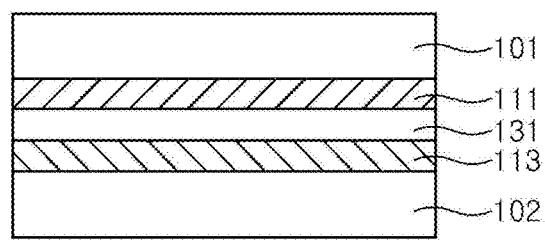
FIGS. 11 and 12 are cross-sectional and perspective views, respectively, illustrating the optical film for the display device according to the second embodiment of the present invention.
Figure 12:
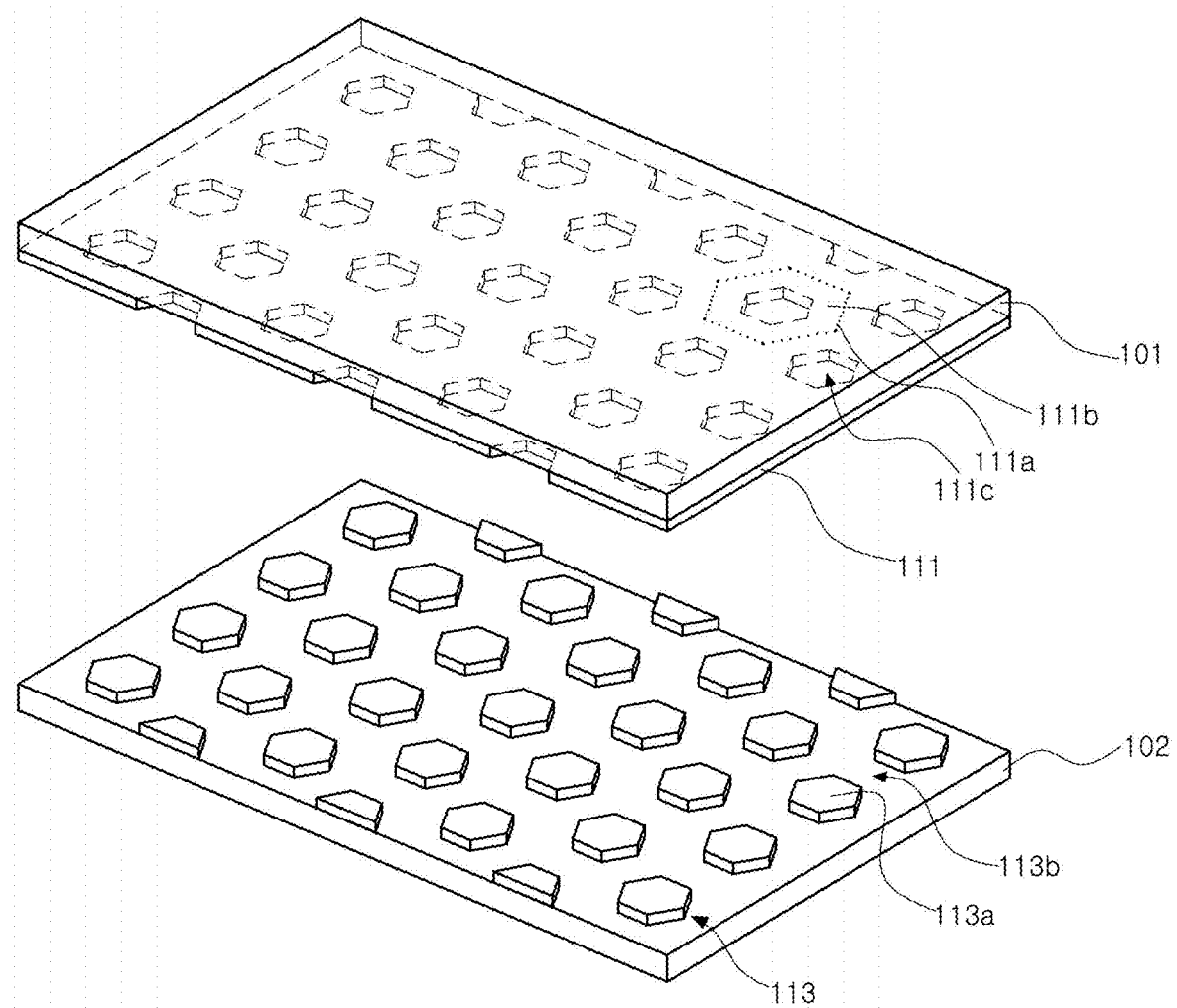

FIGS. 11 and 12 are cross-sectional and perspective views, respectively, illustrating an optical film for a display device according to a second embodiment of the present invention. For the purpose of explanations, detailed structures of a mesh pattern layer and a dot pattern layer are omitted in FIG. 11.

Referring to FIGS. 11 and 12, an optical film 100 for a display device according to this embodiment is applied to a flexible display device.

The optical film 100 may be used as a linear polarization film, or a phase retardation film such as an A-plate or C-plate.

In this embodiment, for the purpose of explanations, the optical film 100 used as a linear polarization film is described by way of example.

The optical film 100 may include a mesh pattern layer 111 having a mesh pattern structure and a dot pattern layer 113 having a dot pattern structure which faces the mesh pattern layer 111.

In addition, the optical film 100 may include a first protection base layer 101 bonded on an outer surface of the mesh pattern layer 111 and a second protection base layer 102 bonded on an outer surface of the dot pattern layer 113.

For the purpose of explanations, a case in which the mesh pattern layer 111 is disposed above the dot pattern layer 113 is described by way of example. Alternatively, the optical film 100 may have an arrangement structure opposite that of the example case.

One of the first protection base layer 101 and the second protection base layer 102 may be removed in a case that the optical film 100 is attached to a display panel of a display device.

In other words, in a state that the optical film 100 is attached to the display panel, one of the first and second protection base layers 101 and 102 may be removed.

In addition, a first bonding layer (or adhesion layer) 131 for bonding the mesh pattern layer 111 and the dot pattern layer 113 may be formed therebetween.

Unlike the first embodiment, the mesh pattern layer 111 and the dot pattern layer 113 are used in this embodiment instead of two mesh pattern layers.

The mesh pattern layer 111 substantially has a mesh structure over the entire optical film 100.

In addition, the dot pattern layer 113 substantially has a dot structure over the entire optical film 100.

The mesh pattern layer 111 and the dot pattern layer 113 may function together as a linear polarization plate.

In other words, the mesh pattern layer 111 may function as a part of the linear polarization plate, and the dot pattern layer 113 may function as another part of the linear polarization plate, so that a stacked structure thereof may function as the linear polarization plate.

To this end, the mesh pattern layer 111 and the dot pattern layer 113 are each formed of a linear polarization material.

The mesh pattern layer 111 may include mesh patterns 111a which are unit patterns for forming the mesh structure.

In addition, the dot pattern layer 113 may include dot patterns 113a which are unit patterns for forming the dot structure.

As the mesh pattern 111a and the dot pattern 113a correspond to each other, it is preferable that the mesh pattern 111a and the dot pattern 113a are formed in the corresponding shapes.

In this regard, the mesh pattern 111a may have any kind of a polygonal mesh shape such as a triangular mesh shape, a tetragonal mesh shape, a pentagonal mesh shape, or a hexagonal mesh shape.

The dot pattern 113a may have a polygonal shape corresponding to the polygonal shape of the mesh pattern 111a.

In this embodiment, a case in which the mesh pattern 111a is formed in a hexagonal mesh shape e.g., a honeycomb shape, and the dot pattern 113a is formed in a corresponding hexagonal shape is described by way of example.

The mesh pattern 111a may include a partition wall 111b forming the corresponding shape, for example, the hexagonal mesh shape, and an inner hole 111c surrounded by the partition wall 111b is defined inside the mesh pattern 111a.

The dot pattern 113a may have a size which is substantially the same or greater than that of the inner hole 111c. In addition, spacing grooves 113b which are spaces between the dot patterns 113a are formed in a mesh shape to substantially correspond to the partition walls 111b of the mesh patterns 111a.

The dot pattern 113a is positioned to correspond to the inner hole 111c. In other words, the dot pattern 113a may be arranged to be matched with the inner hole 111c.

The mesh pattern layer 111 may be formed using a mesh mask which is a mask having open holes in a corresponding mesh shape. In addition, the dot pattern layer 113 may be formed using a dot mask having open holes in a corresponding dot shape. In this regard, the open holes of the mesh mask for the mesh pattern layer 111 correspond to the partition walls 111b of the mesh pattern layer 111.

For example, while the first protection base layer 101 wound around a roll is moved in one direction, the mesh mask having open holes in the mesh shape is disposed on the first protection base layer 101. In this state, one surface of the first protection base layer 101 is coated with a liquid crystal material through the open holes of the mesh mask, and light is irradiated to the one surface to align the liquid crystal material. Accordingly, the first mesh pattern layer 111 may be formed on the first protection base layer 101.

In addition, while the second protection base layer 102 wound around a roll is moved in one direction, a dot mask having open holes in a dot shape is disposed on the second protection base layer 102. In this state, one surface of the second protection base layer 102 is coated with a liquid crystal material through the open holes of the dot mask, and light is irradiated to the one surface to align the liquid crystal material. Accordingly, the dot pattern layer 113 may be formed on the second protection base layer 102.

The first mesh pattern layer 111 and the dot pattern layer 113 are disposed such that a center of the mesh pattern 111a matches a center of the dot pattern 113a.

Accordingly, the inner hole 111c of the mesh pattern 111a may be covered and completely hidden by the dot pattern 113a of the same matched polygonal shape.

Figure 13:
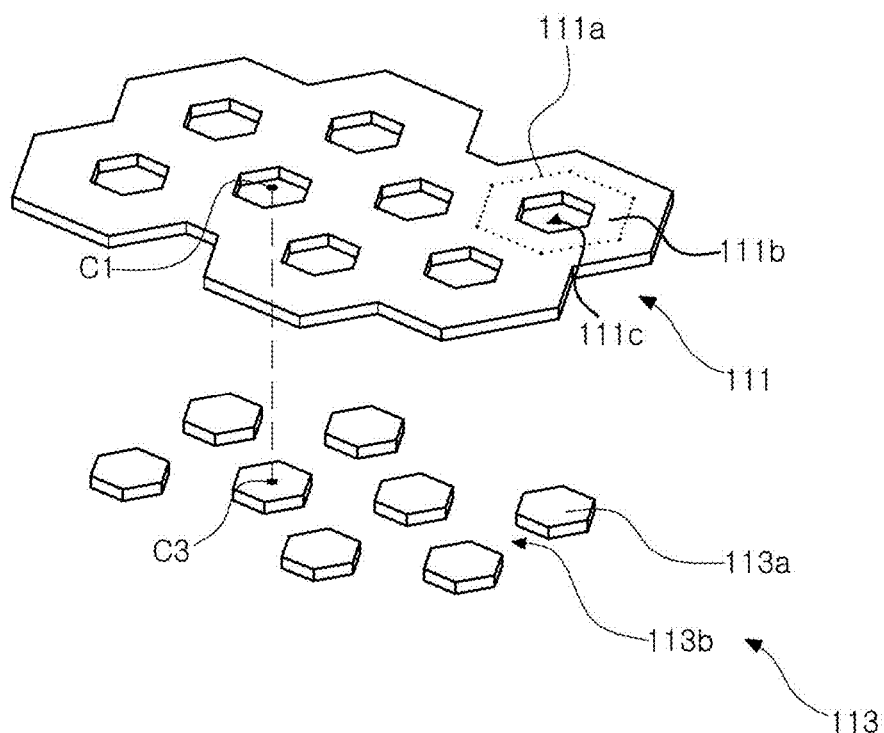
FIGS. 13 and 14 are perspective and plan views, respectively, illustrating an arrangement relationship between a mesh pattern layer and a dot pattern layer according to a second embodiment of the present invention.
Figure 14:
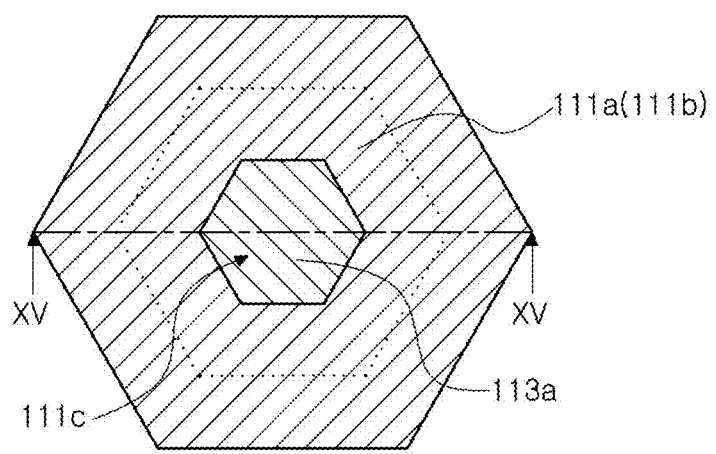
Figure 15:
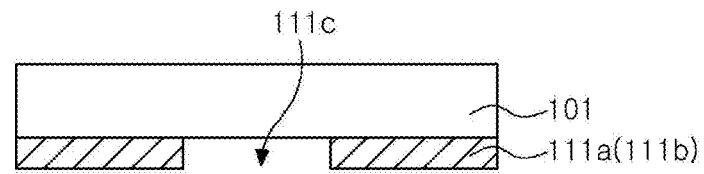
FIG. 15 is a cross-sectional view taken along line XV-XV of FIG. 14.
Figure 15:
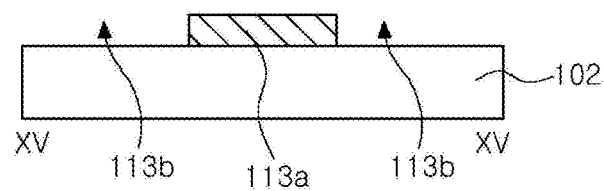

In this regard, detailed explanations are made further with reference to FIGS. 13 to 15.

FIGS. 13 and 14 are perspective and plan views, respectively, illustrating an arrangement relationship between a mesh pattern layer and a dot pattern layer according to a second embodiment of the present invention, and FIG. 15 is a cross-sectional view taken along a line XV-XV of FIG. 14.

Referring to FIGS. 13 to 15, the lower dot pattern layer 113 and the upper mesh pattern layer 111 are disposed such that centers of the mesh patterns 111a and the dot patterns 113a are aligned.

In other words, a first center C1 as a center of the inner hole 111c of the mesh pattern 111a is arranged to match a third center C3 as a center of the dot pattern 113a.

By arranging the mesh patterns 111a and the dot patterns 113a with the centers thereof aligned, the inner holes 111c of mesh patterns 111a are covered and completely hidden by the dot patterns 113a.

Similarly, the spacing grooves 113b in a mesh shape surrounding the dot patterns 113a may be covered and completely hidden by the mesh patterns 111a.

Since the dot patterns 113a are disposed to hide the inner holes 111c of the mesh patterns 111a, the stacked structure including the mesh pattern layer 111 and the dot pattern layer 113 may be seen such that the stacked structure is formed over the entire optical film 100, when viewed from above.

Accordingly, the entirety of the optical film 100 may have substantially uniform optical properties.

In addition, since the optical film 100 of this embodiment is formed by stacking the pattern layer 111 of the mesh structure and the pattern layer 113 of the dot structure, the optical film 100 may be effectively applied to a flexible display device.

In this regard, since the mesh structure has holes therein, and a tensile or contractile force is dispersed along the mesh patterns in a bent state due to structural properties, a stress applied to the mesh structure is significantly reduced.

In addition, since the dot structure is a structure in which the dot patterns spaced apart from each other are dispersed and a tensile or contractile force is dispersed in a bent state due to structural properties, a stress applied to the dot structure is significantly reduced.

Accordingly, a maximum stress applied thereto in the bent state is much less than a rupture strength of the optical film 100 having the mesh/dot structure, crack occurrence can be reduced at a bent portion.

In addition, even when cracks occur at the pattern layers of the mesh structure/dot structure, the generated cracks can be prevented from spreading along the bent portion due to the structural properties of the mesh structure/dot structure.

As described above, when the optical film 100 is formed in the mesh structure/dot structure, crack occurrence at the bent portion can be effectively reduced.

Accordingly, the optical film 100 having the mesh structure/dot structure can be effectively applied to a flexible display device.

For example, in the case of the optical film 100 having the mesh structure/dot structure according to this embodiment, like the first embodiment, cracks do not occur practically in the bent state because a maximum stress applied to a bent portion in an extreme radius of curvature test is much less than a rupture strength of 72.97 MPa.

In the above-described embodiment, the optical film 100 having the mesh structure used as the linear polarization film is described by way of example.

Alternatively, the above optical film 100 having the mesh structure may be used as a phase retardation film such as an A-plate or C-plate.

Figure 16:
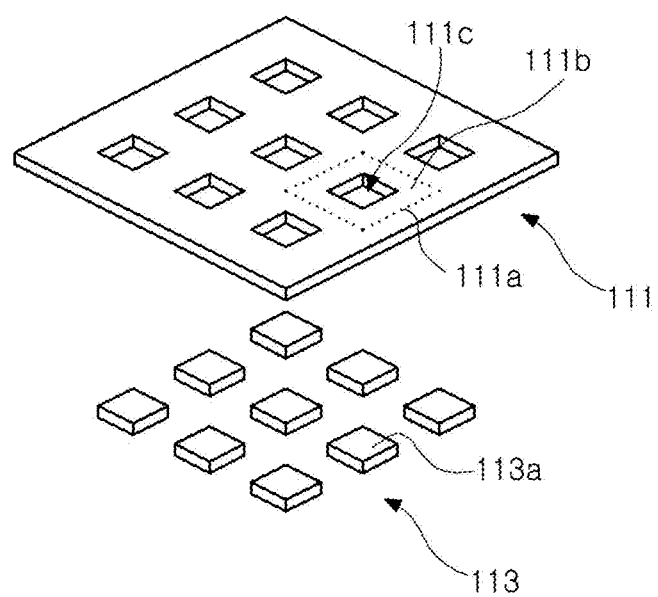
FIGS. 16 and 17 are views illustrating a case in which the mesh pattern layer and the dot pattern layer according to the second embodiment of the present invention respectively have a tetragonal mesh structure and a tetragonal structure and a case in which the mesh pattern layer and the dot pattern layer respectively have a triangular mesh structure and a triangular structure.
Figure 17:
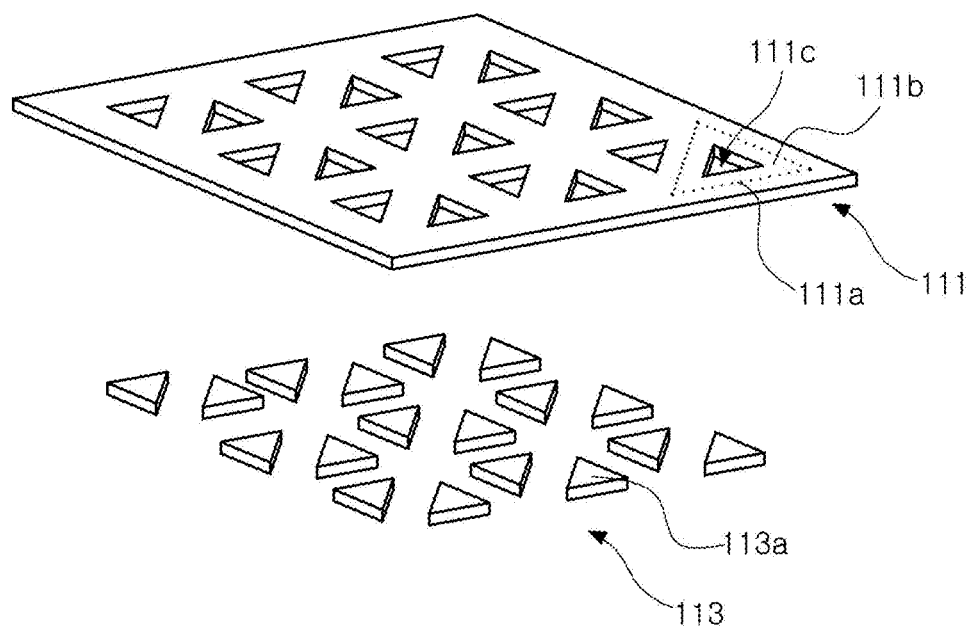

In addition, in the above embodiment, a hexagonal mesh structure/hexagonal dot structure is described by way of example. Alternatively, a tetragonal mesh structure/tetragonal dot structure or triangular mesh structure/triangular dot structure, as shown in FIG. 16 or 17, may be used as another polygonal mesh structure/polygonal dot structure.

In the tetragonal mesh structure/tetragonal dot structure or the triangular mesh structure/triangular dot structure, a mesh pattern layer 111 and a dot pattern layer 113 are disposed to be aligned.

The optical film 100 according to this embodiment may be formed as an optical compensation film in which a plurality of stacked structures, which each have a mesh/dot structure including a mesh pattern layer 111 and a dot pattern layer 113, are layered. The optical compensation film including the plurality of stacked structures of this embodiment may be similar to that of FIG. 9 of the first embodiment.

Figure 18:
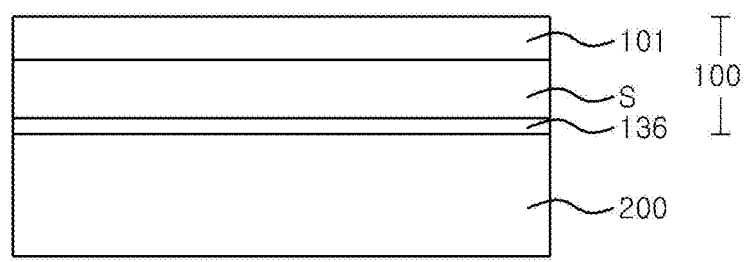
FIG. 18 is a schematic cross-sectional view illustrating a display device in which the optical film according to the second embodiment of the present invention is attached to a display panel.

FIG. 18 is a schematic cross-sectional view illustrating a display device in which the optical film according to the second embodiment of the present invention is attached to a display panel.

Referring to FIG. 18, a display device 10 includes the optical film 100 and a display panel 200.

The display panel 200 may have flexible properties and include any kind of display panel including an organic light emitting panel.

The optical film 100 having the mesh structure/dot structure may be attached on one surface, for example a display surface of the display panel 200.

In the optical film 100, a protection base layer, for example, a first protection base layer 101, may be disposed at an outermost side, and a stacked structure S having a mesh structure/dot structure may be disposed on an inner surface of the first protection base layer 101. The stacked structure S having the mesh/dot structure may be referred with the above description.

One of the mesh pattern layer 111 and the dot pattern layer 113 may be disposed close to the first protection base layer 101 and the other one may be disposed close to the display panel 200.

The optical film 100 may be bonded to the display panel 200 by a bonding layer 136.

As described above, in this embodiment, the optical film may be formed by stacking two pattern layers having the mesh structure/dot structure.

Accordingly, since a maximum stress applied to the optical film in a bent state is much less than a rupture strength of the optical film having the mesh structure/dot structure, crack occurrence at a bent portion can be reduced.

Accordingly, the optical film having the mesh structure/dot structure can be effectively applied to a flexible display device.

In the above-described embodiments of the present invention, two pattern layers having a mesh structure or mesh structure/dot structure can be stacked to form an optical film.

Accordingly, since a maximum stress in a bent state is much less than a rupture strength of the optical film, crack occurrence at a bent portion can be reduced.

Accordingly, the optical film can be effectively applied to a flexible display device.

It will be apparent to those skilled in the art that various modifications and variations can be made in optical film and the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An optical film for a display device, comprising:
   a first mesh pattern layer in which a plurality of first mesh patterns, each including a first inner hole, are arranged; and
   a second mesh pattern layer that faces the first mesh pattern layer, and in which a plurality of second mesh patterns, each including a second inner hole, are arranged,
   wherein a center of the first mesh pattern and a center of the second mesh pattern are arranged to be misaligned, and
   wherein the first and second mesh patterns are each formed of a linear polarization liquid crystal material or phase retardation liquid crystal material.

2. The optical film of claim 1, wherein:
   the center of the first mesh pattern is positioned at a center position of the adjacent second mesh patterns; and
   the center of the second mesh pattern is positioned at a center position of the adjacent first mesh patterns.

3. The optical film of claim 1, wherein:
each of the plurality of first mesh patterns includes a first partition wall surrounding the first inner hole;
each of the plurality of second mesh patterns includes a second partition wall surrounding the second inner hole;
the first inner hole is hidden by the second partition walls of the second mesh patterns corresponding to the first inner hole; and
the second inner hole is hidden by the first partition walls of the first mesh patterns corresponding to the second inner hole.

4. The optical film of claim 1, wherein the first and second mesh patterns each have a polygonal shape.

5. The optical film of claim 1, further comprising a bonding layer interposed between the first and second mesh layers.

6. An optical film for a display device, comprising:
a mesh pattern layer in which a plurality of mesh patterns, respectively including a plurality of inner holes, are arranged; and
a dot pattern layer that faces the mesh pattern layer, and in which a plurality of dot patterns are arranged corresponding to the plurality of inner holes, respectively,
wherein the mesh pattern and the dot pattern are each formed of a linear polarization liquid crystal material or phase retardation liquid crystal material.

7. The optical film of claim 6, wherein the inner hole is hidden by the dot pattern.

8. The optical film of claim 6, wherein:
the mesh pattern has a polygonal shape; and
the dot pattern has a polygonal shape corresponding to the mesh pattern.

9. The optical film of claim 6, further comprising a bonding layer interposed between the mesh pattern layer and the dot pattern layer.

10. The optical film of claim 6, wherein a size of each of the plurality of dot patterns is greater than or equal to a size of each of the plurality of inner holes.

11. A display device, comprising:
an optical film; and
a display panel to which the optical film is attached,
wherein the optical film includes:
    a first mesh pattern layer in which a plurality of first mesh patterns, each including a first inner hole, are arranged, and
    a second mesh pattern layer that faces the first mesh pattern layer, and in which a plurality of second mesh patterns, each including a second inner hole, are arranged,
wherein a center of the first mesh pattern and a center of the second mesh pattern are arranged to be misaligned, and
wherein the first and second mesh patterns are each formed of a linear polarization liquid crystal material or phase retardation liquid crystal material.

12. The display device of claim 11, wherein:
the center of the first mesh pattern is positioned at a center position of the adjacent second mesh patterns; and
the center of the second mesh pattern is positioned at a center position of the adjacent first mesh patterns.

13. The display device of claim 11, wherein:
each of the plurality of first mesh patterns includes a first partition wall surrounding the first inner hole;
each of the plurality of second mesh patterns includes a second partition wall surrounding the second inner hole;
the first inner hole is hidden by the second partition walls of the second mesh patterns corresponding to the first inner hole; and
the second inner hole is hidden by the first partition walls of the first mesh patterns corresponding to the second inner hole.

14. The display device of claim 11, wherein the first and second mesh patterns each have a polygonal shape.

15. The display device of claim 11, wherein the display panel has a flexible property.

16. A display device, comprising:
an optical film; and
a display panel to which the optical film is attached,
wherein the optical film includes:
    a mesh pattern layer in which a plurality of mesh patterns, respectively including a plurality of inner holes, are arranged; and
    a dot pattern layer that faces the mesh pattern layer, and in which a plurality of dot patterns are arranged corresponding to the plurality of inner holes, respectively, and
wherein the mesh pattern and the dot pattern are each formed of a linear polarization liquid crystal material or phase retardation liquid crystal material.

17. The display device of claim 16, wherein the inner hole is hidden by the dot pattern.

18. The display device of claim 16, wherein:
the mesh pattern has a polygonal shape; and
the dot pattern has a polygonal shape corresponding to the mesh pattern.

19. The display device of claim 16, wherein the display panel has a flexible property.

20. The display device of claim 16, wherein a size of each of the plurality of dot patterns is greater than or equal to a size of each of the plurality of inner holes.

* * * * *